(12) United States Patent
Yuan et al.

(10) Patent No.: US 11,665,816 B2
(45) Date of Patent: May 30, 2023

(54) CIRCUIT BOARD, METHOD FOR MANUFACTURING CIRCUIT BOARD, AND ELECTRONIC DEVICE

(71) Applicant: Huawei Technologies Co., Ltd., Shenzhen (CN)

(72) Inventors: Zhi Yuan, Shanghai (CN); Guo Yang, Minsk (BY); Jian Shi, Shanghai (CN); Linfang Jin, Dongguan (CN); Zhen Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 46 days.

(21) Appl. No.: 17/598,530

(22) PCT Filed: Mar. 27, 2020

(86) PCT No.: PCT/CN2020/081527
§ 371 (c)(1),
(2) Date: Sep. 27, 2021

(87) PCT Pub. No.: WO2020/192744
PCT Pub. Date: Oct. 1, 2020

(65) Prior Publication Data
US 2022/0183146 A1    Jun. 9, 2022

(30) Foreign Application Priority Data
Mar. 28, 2019   (CN) .................. 201910246175.3

(51) Int. Cl.
*H05K 1/02* (2006.01)
*H05K 3/46* (2006.01)

(52) U.S. Cl.
CPC ........ *H05K 1/0272* (2013.01); *H05K 1/0203* (2013.01); *H05K 1/0219* (2013.01); *H05K 3/4644* (2013.01); *H05K 2201/064* (2013.01); *H05K 2201/10121* (2013.01)

(58) Field of Classification Search
CPC .............. H05K 1/0203; H05K 1/0207; H05K 2201/064; H05K 2201/06; H05K 2201/062; H05K 1/0272
See application file for complete search history.

(56) References Cited

U.S. PATENT DOCUMENTS

| | | | |
|---|---|---|---|
| 4,519,447 | A | 5/1985 | Wiech, Jr. |
| 2005/0006115 | A1 | 1/2005 | Ding et al. |
| 2008/0055860 | A1 | 3/2008 | Taniguchi et al. |
| 2008/0156519 | A1 | 7/2008 | Lin et al. |
| 2014/0362552 | A1 | 12/2014 | Murayama et al. |

FOREIGN PATENT DOCUMENTS

| | | |
|---|---|---|
| CN | 2710320 Y | 7/2005 |
| CN | 101142866 A | 3/2008 |
| CN | 203574995 U | 4/2014 |
| CN | 105407686 A | 3/2016 |

(Continued)

*Primary Examiner* — Jeremy C Norris
(74) *Attorney, Agent, or Firm* — Conley Rose, P.C.

(57) ABSTRACT

In an electronic device, a circuit board connects different systems or structures such that heat of a system with a relatively large amount of heat can be transferred to a position or a heat dissipation structure with a relatively small amount of heat, thereby mitigating local high temperatures in the electronic device and distributing heat more evenly throughout the electronic device.

20 Claims, 10 Drawing Sheets

(56) References Cited

FOREIGN PATENT DOCUMENTS

| | | | |
|---|---|---|---|
| CN | 105744732 | A | 7/2016 |
| CN | 105873369 | A | 8/2016 |
| CN | 105934080 | A | 9/2016 |
| CN | 106102306 | A | 11/2016 |
| CN | 206260197 | U | 6/2017 |
| CN | 107734840 | A | 2/2018 |
| CN | 207692149 | U | 8/2018 |
| CN | 109121282 | A | 1/2019 |
| CN | 109922599 | A | 6/2019 |
| EP | 1494109 | A2 | 1/2005 |
| EP | 2053906 | A2 | 4/2009 |
| TW | 591984 | B | 6/2004 |
| WO | 2018000848 | A1 | 1/2018 |

CIRCUIT BOARD, METHOD FOR MANUFACTURING CIRCUIT BOARD, AND ELECTRONIC DEVICE

CROSS-REFERENCE TO RELATED APPLICATIONS

This is a U.S. National Stage of International Patent Application No. PCT/CN2020/081527 filed on Mar. 27, 2020, which claims priority to Chinese Patent Application No. 201910246175.3 filed on Mar. 28, 2019. Both of the aforementioned applications are hereby incorporated by reference in their entireties.

TECHNICAL FIELD

This application relates to the field of electronic information technologies, and in particular, to a circuit board, a method for manufacturing the circuit board, and an electronic device including the circuit board.

BACKGROUND

With the development of electronic information technologies, there are increasingly more types of functional modules of an electronic device. The functional modules are generally connected by using a circuit board, and heat is transferred from a high-heat zone to a low-heat zone by using the circuit board, to resolve a problem of overheating of a module that generates a relatively large amount of heat. For example, in a smartphone, there is a screen module, a camera module, a fingerprint module, a battery module, a wireless charging coil module, and the like, Each module is connected to a mainboard or a middle frame of the mobile phone by using a flexible printed circuit board (Flexible Printed Circuit, FPC), to perform heat dissipation. The circuit board generally includes an insulation layer and a copper layer (an etched copper line layer). Because the insulation layer has relatively low thermal conductivity, most of the heat is transferred to the low-heat zone through the copper layer of the circuit board. However, a thickness of the circuit board is generally relatively thin, and a proportion of the copper layer in the circuit board does not exceed 50%. Therefore, the circuit board has a limited capability to conduct heat, and the electronic device is prone to local overheating.

SUMMARY

This application provides a circuit board, a method for manufacturing the circuit board, and an electronic device including the circuit board, to enhance thermal conductivity of the circuit board, and alleviate or avoid a problem of local overheating of the electronic device.

According to a first aspect, this application provides a circuit board. The circuit board includes a signal layer, an insulation layer, and a thermally conductive layer that are disposed in a stacked manner. The signal layer is separated from the thermally conductive layer by using the insulation layer, the thermally conductive layer includes one group of flow passageways or a plurality of groups of flow passageways, and the plurality of groups of flow passageways are disposed at intervals in a length direction of a thermally conductive plate. Each group of flow passageways includes a first flow passageway and a second flow passageway that are disposed in parallel at intervals in a width direction of the circuit board, and connecting flow passageways that are disposed at both ends of the first flow passageway and the second flow passageway. Both the first flow passageway and the second flow passageway extend along a length direction of the circuit board, the first flow passageway and the second flow passageway are connected by using the connecting flow passageways, a cross-sectional area of the first flow passageway is less than a cross-sectional area of the second flow passageway, and the first flow passageway has capillary force. A cooling medium is sealed in closed space formed by the first flow passageway, the second flow passageway, and the connecting flow passageways, and the cooling medium performs vapor-liquid change in the closed space.

In this application, the thermally conductive layer is disposed in the circuit board, to enhance thermal conductivity of the circuit board by using the thermally conductive layer. Specifically, when the circuit board is connected to two modules with different amounts of heat, a high temperature zone is formed at a position that is of the circuit board and that corresponds to a module with a large amount of heat, and a low temperature zone is formed at a position that is of the circuit board and that corresponds to a module with a small amount of heat. In this application, the cooling medium can perform vapor-liquid change in the closed space formed by the first flow passageway, the second flow passageway, and the connecting flow passageways. In other words, in the closed space formed by the first flow passageway, the second flow passageway, and the third flow passageways, the cooling medium can be converted from a vapor state to a liquid state or from a liquid state to a vapor state, thereby implementing mutual conversion between the liquid state and the vapor state. The cooling medium in the liquid state can absorb heat in the high temperature zone to vaporize, and the vaporized cooling medium in the vapor state can flow to the low temperature zone through the second flow passageway, and liquefy in the low temperature zone. Because the first flow passageway has the capillary force, the liquefied cooling medium can flow in the first flow passageway under the action of the capillary force and flow to the high temperature zone, so that the cooling medium circulates between the low temperature zone and the high temperature zone and performs vapor-liquid change, to transfer heat from the high temperature zone to the low temperature zone, thereby avoiding heat concentration in the high temperature zone.

In some embodiments of this application, an outermost layer of the circuit board is the insulation layer, and the thermally conductive layer is attached to the outermost insulation layer. In some embodiments of this application, the thermally conductive layer is generally made of a metal material, and the insulation layer is attached to an outer side of the thermally conductive layer, so that the insulation layer is used to prevent external water, oxygen, and the like from corroding the thermally conductive layer. In addition, the thermally conductive layer is attached to the outermost insulation layer, so that the thermally conductive layer is closest to an outer surface of the circuit board under the condition of ensuring that the thermally conductive layer is not to be corroded by external water, oxygen, and the like. When a heating module is connected to the circuit board, the outer surface of the circuit board is attached to the heating module. In this case, because the thermally conductive layer is closest to the outer surface of the circuit board, the thermally conductive layer is close to the heating module, so that heat of the heating module can be absorbed as much as possible to be transferred to the low temperature zone, thereby achieving a better thermal conduction effect.

In some embodiments, there is a plurality of thermally conductive layers, and first flow passageways of two adjacent thermally conductive layers are disposed in a staggered manner in a thickness direction of the circuit board. To be specific, an orthographic projection of a first flow passageway or a second flow passageway of one thermally conductive layer on the other thermally conductive layer is located at a position between two adjacent flow passageways of the other thermally conductive layer, to prevent flow passageways of all thermally conductive layers from being located at a same position in the thickness direction of the circuit board, thereby reducing impact of the thermally conductive layers on strength of the circuit board in the thickness direction.

It may be understood that, in the circuit board of this application, there may be a plurality of signal layers, to achieve a better signal transmission effect. In addition, the plurality of signal layers are disposed at intervals and insulated to avoid mutual impact between the signal layers.

In some embodiments, the circuit board farther includes two signal shield layers, and the signal layer is located between the two signal shield layers. In this way, impact of an external signal on the signal layer can be shielded by using the signal shield layers, so that the circuit board has a better signal shielding effect.

In some embodiments, the circuit hoard includes one signal shield layer, and the signal shield layer is disposed in a stacked manner on a side that is of the signal layer and that is away from the thermally conductive layer. The thermally conductive layer is made of a metal material, thereby having a signal shielding function. The signal layer is disposed between the signal shield layer and the thermally conductive layer, so that an external signal can also be shielded, thereby preventing the external signal from affecting signal transmission at the signal layer. In addition, in these embodiments, it is equivalent to replacing one signal shield layer with the thermally conductive layer, to enhance a thermal conduction effect of the circuit board when achieving a good signal shielding effect, and avoid greatly increasing a thickness of the circuit board.

In some embodiments, there is a plurality of thermally conductive layers, and the signal layer is located between any two of the plurality of thermally conductive layers. In these embodiments, it is equivalent to completely replacing the signal shield layers with the thermal conductive layers, so that the thermally conductive layers shield impact of an external signal on the signal layer, to further enhance a thermal conduction effect of the thermally conductive layers when achieving a better signal shielding effect of the circuit board, and avoid greatly increasing a thickness of the circuit board.

Specifically, in some embodiments of this application, there are two groups of flow passageways, and some first flow passageways in the two groups of flow passageways are connected by using a connecting flow passageway between the two groups of flow passageways. In actual application of the circuit board in these embodiments, because there are the first flow passageways connecting the two groups of flow passageways, heat can be transferred between two ends that are of the two groups of flow passageways and that are away from each other. In addition, because there are also flow passageways disposed at intervals in the length direction, a case in which heat flows from a position between the two groups of flow passageways to the two ends that are of the two groups of flow passageways and that are away from each other can be further implemented, or a case in which heat flows from the two ends that are of the two groups of flow passageways and that are away from each other to a position between the two groups of flow passageways can be implemented.

In some other embodiments of this application, the thermally conductive layer includes a main flow passageway and a plurality of branch flow passageways connected to the main flow passageway, a first flow passageway and a second flow passageway are disposed on each branch flow passageway, and all the first flow passageways and the second flow passageways that are disposed on the branch flow passageways extend to the main flow passageway. In these embodiments, heat can be transferred from the main flow passageway to each branch flow passageway or from each branch flow passageway to the main flow passageway.

In some embodiments of this application, a capillary force enhancing structure is disposed in the first flow passageway, to enhance the capillary force of the first flow passageway. The capillary force enhancing structure may be a capillary structure sintered by a copper mesh or copper powder.

In some embodiments of this application, a support pillar is disposed in the second flow passageway, one end of the support pillar is fastened to a bottom wall of the second flow passageway, the other end of the support pillar extends along the thickness direction of the circuit board toward a top wall of the second flow passageway, and the other end of the support pillar abuts the top wall of the second flow passageway, or a gap is formed between the other end of the support pillar and the top wall of the second flow passageway. The support pillar is disposed in the second flow passageway, so that the second flow passageway is prevented from being damaged when the circuit board is subjected to pressure in the thickness direction.

In some embodiments of this application, the first flow passageway includes a straight flow section and a curved flow section connected to the straight flow section, and the curved flow section is located at one end of the first flow passageway. When the first flow passageway is of a curve type, if a transmission distance (linear distance) is the same, a path in which the cooling medium flows in the flow passageway is longer, so that a time during which the cooling medium flows in the flow passageway is prolonged, thereby facilitating absorption of more heat, to achieve a better heat transfer effect.

It may be understood that, in some embodiments, the first flow passageways may all be straight flow passageways or curved flow passageways.

In this application, the thickness of the circuit board is generally limited. Therefore, a thickness of the thermally conductive layer and depths of the first flow passageway, the second flow passageway, and the connecting flow passageway are all limited to some extent. In an embodiment of this application, the thickness of the thermally conductive layer is about 0.01 mm to 1 mm. The depths of the first flow passageway, the second flow passageway, and the connecting flow passageway are about 0.005 mm to 1 mm. In addition, because the first flow passageway, the second flow passageway, and the connecting flow passageway are all embedded in the thermally conductive layer, depths of the first flow passageway and the second flow passageway need to be less than the thicknesses of the thermally conductive layer.

Further, in this application, a distance between adjacent first flow passageways and a distance between a first flow passageway and a second flow passageway that are adjacent to each other need to be within a specific range, so that a support pillar formed between two adjacent first flow passageways and a support pillar formed between a first flow passageway and a second flow passageway that are adjacent to each other have some strength, and can withstand some pressure from the thickness direction of the circuit board. In some embodiments of this application, the distance between the adjacent first flow passageways and the distance between the first flow passageway and the second flow passageway that are adjacent to each other are about 0.01 mm to 10 mm.

Further, in this application, a distance between a first flow passageway, a second flow passageway, or a connecting flow passageway closest to an edge of the thermally conductive layer and the edge of the thermally conductive layer also needs to be within a specific range, to prevent an external object from damaging the flow passageway from a side wall of the thermally conductive layer. In some embodiments of this application, the distance between the first flow passageway, the second flow passageway, or the connecting flow passageway closest to the edge of the thermally conductive layer and the edge of the thermally conductive layer is about 0.1 mm to 10 mm.

In some embodiments of this application, a percentage of a space volume occupied by the cooling medium in a space volume of the first flow passageway, the second flow passageway, and the connecting flow passageway is 0.1% to 50%, to achieve a better vapor-liquid circulation effect and implement more efficient heat transfer.

According to a second aspect, this application further provides a method for manufacturing a circuit board. The method for manufacturing a circuit board includes steps of:

forming a first metal material layer on a first insulation layer;

patterning the first metal material layer to obtain a first metal layer, where a groove pattern is formed on the first metal layer; the groove pattern includes a first groove, a second groove, and connecting grooves; the first groove and the second groove are disposed in parallel at intervals in a width direction of a circuit board, and the connecting grooves are respectively located on both sides of the first groove and the second groove, and are configured to connect the first groove and the second groove;

covering the first metal layer with a second metal layer, where the second metal layer seals the groove pattern to obtain a first flow passageway, a second flow passageway, and connecting flow passageways, and the patterned first metal layer and the second metal layer stacked on the first metal layer form a thermally conductive layer of the circuit board;

vacuumizing the first flow passageway, the second flow passageway, and the connecting flow passageways and injecting a cooling medium;

sequentially forming a second insulation layer and a second metal material layer on a side that is of the thermally conductive layer and that is away from the first insulation layer;

patterning the second metal material layer to obtain a signal layer, which is a signal layer of a plurality of signal cables; and forming a third insulation layer on a side that is of the signal layer and that is away from the thermally conductive layer.

Further, in some embodiments, the method for manufacturing a circuit board further includes a step of sequentially forming a third metal layer and a fourth insulation layer on a side that is of the third insulation layer and that is away from the signal layer, where the third metal layer is a signal shield layer of the circuit board.

According to a third aspect, this application further provides an electronic device. The electronic device includes a first module, a second module, and the foregoing circuit board. Heat of the first module is greater than heat of the second module, the circuit board connects the first module and the second module, and the circuit board is configured to transfer heat of the first module to the second module. In this way, heat concentration at a position of the first module is avoided, and a problem of local overheating of the electronic device is avoided.

Further, in some embodiments, a third module is disposed between the first module and the second module, the circuit board passes through the third module and is attached to the third module, and the circuit board is configured to transfer heat of the first module and the third module to the second module.

Further, in some embodiments, the first module and the second module are located on a same surface of the circuit board, and relative to a signal layer of the circuit hoard, a thermally conductive layer in the circuit board is close to the first module. In other words, the thermally conductive layer can be as close to a heat source (the first module) as possible, so that heat of the heat source can be better absorbed, and the circuit board can achieve a better heat transfer effect. In this way, heat concentration at the position of the first module is further avoided, and the problem of local overheating of the electronic device is avoided.

In some embodiments of this application, the first module may be any one of modules such as a screen module, a camera module, a fingerprint module, a structured light module, a motor module, a battery module, or a wireless charging module. The second module may be a structure such as a middle frame or a housing, so that heat of each module is transferred to the middle frame or the housing and dissipated out of the electronic device, to achieve a good heat dissipation effect.

BRIEF DESCRIPTION OF DRAWINGS

To describe structural features and functions of this application more clearly, the following describes the structural features and the functions in detail with reference to accompanying drawings and specific embodiments.

DESCRIPTION OF EMBODIMENTS

Figure 1:
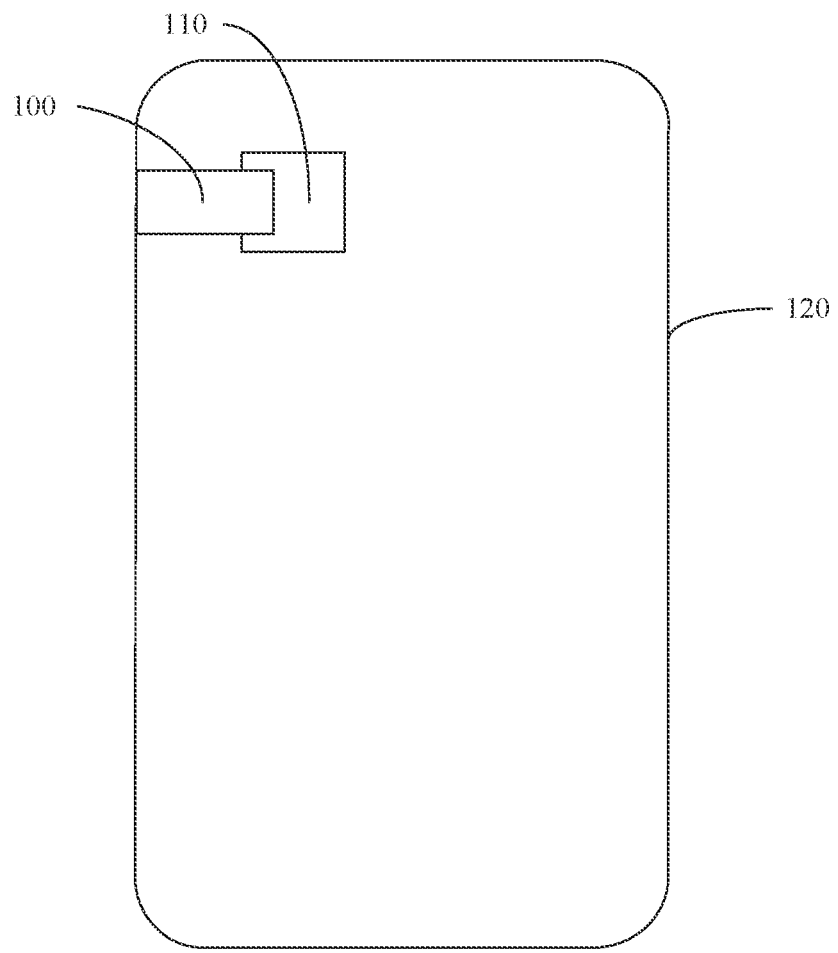
FIG. 1 is a schematic structural diagram of an electronic device according to an embodiment of this application.

To describe structural features and functions of this application more clearly, the following describes the structural features and the functions in detail with reference to accompanying drawings and specific embodiments.

This application provides a circuit board, a method for manufacturing the circuit board, and an electronic device that includes the circuit board. The circuit board has a good thermal conduction effect, and can transfer heat of a module or a structure with high heat in the electronic device to a module or a structure with low heat, thereby alleviating or avoiding a problem that a local temperature of the electronic device is excessively high. In this application, the circuit board may be a flexible printed circuit board (Flexible Printed Circuit board, FPCB or FPC for short) or a rigid printed circuit board (Printed Circuit Board, PCB).

The electronic device may be various electronic devices such as a mobile phone, a computer, a tablet, a television, or a smartwatch. The electronic device includes a housing and an electronic component housed in the housing.

In some embodiments, the electronic device includes a first module, a second module, and a circuit board connecting the first module and the second module. In an embodiment of this application, the electronic device is a mobile phone, and the first module and the second module may be various modules such as a screen module, a camera module, a fingerprint module, a structured light module, a motor module, a battery module, or a wireless charging module, or may be mobile phone mechanical parts such as a middle frame or a housing in the mobile phone. Heat of the first module is greater than heat of the second module, and the circuit board can transfer heat of the first module to the second module. In some embodiments, the first module max be any one of modules such as a screen module, a camera module, a fingerprint module, a structured light module, a motor module, a battery module, or a wireless charging module. The second module may be a structure such as a middle frame or a housing, so that heat of each module is transferred to the middle frame or the housing of the mobile phone. It may be understood that, in some other embodiments of this application, the circuit board may alternatively he connected to any two of modules such as a screen module, a camera module, a fingerprint module, a structured light module, a motor module, a battery module, or a wireless charging module based on an actual requirement. In other words, the first module and the second module are respectively any one of a screen module, a camera module, a fingerprint module, a structured light module, a motor module, a battery module, or a wireless charging module. Alternatively, the first module and the second module may be respectively structures such as a mainboard and a small board of the electronic device. It may be understood that, in different electronic devices, types of the first module and the second module may be other structures. The description in this application is merely an example.

Figure 2:
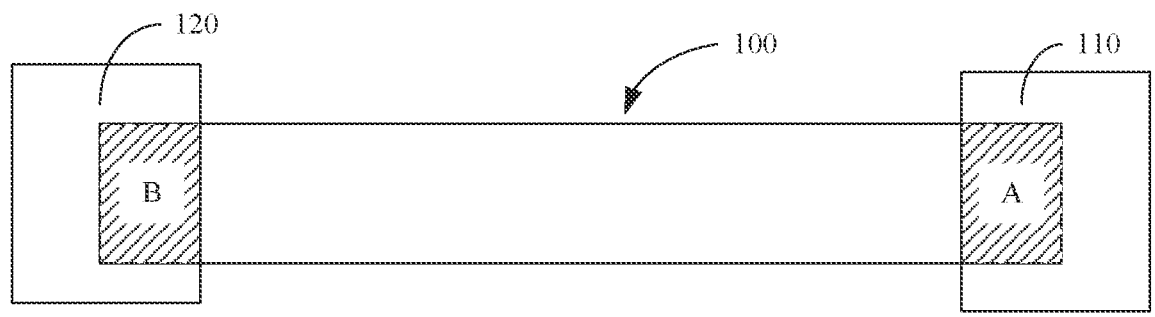
FIG. 2 is a schematic application diagram of a circuit board in the electronic device shown in FIG. 1.

For example, FIG. 1 shows an electronic device according to an embodiment of this application. The electronic device shown in FIG. 1 is a mobile phone. The first module is a camera module 110, and the second module is a middle frame 120. The camera module 110 of the mobile phone is connected to the middle frame 120 of the mobile phone by using a circuit board 100. That is, two ends of the circuit board 100 are respectively bonded to the camera module 110 and the middle frame 120. FIG. 2 is a schematic diagram in which the circuit board 100 connects the camera module 110 and the middle frame 120. The camera module 110 and the middle frame 120 shown in FIG. 2 are merely schematic patterns. The camera module 110 generates heat when working. Therefore, a high temperature zone A is formed at a position at which the circuit board 100 is connected to the camera module 110. Because the middle frame 120 does not generate heat, a low temperature zone B is formed at a position at which the circuit board 100 is connected to the middle frame 120. It may be understood that the position of the high temperature zone A in the figure is merely a schematic pattern. Actually, heat may also be transferred to a position that is on the circuit board 100 and that is not connected to the camera module 110, so that the position that is on the circuit board 100 and that is not connected to the camera module 110 may also be a part of the high temperature zone A. Similarly, the position of the low temperature zone B in the figure is merely a schematic pattern. Heat in the high temperature area A is transferred to the low temperature area B by using the circuit board 100. Therefore, heat generated by the camera module 110 is transferred to the middle frame 120 by using the circuit board 100, and then the middle frame 120 dissipates the heat, thereby implementing efficient heat dissipation of the camera module 110 of the electronic device. It may be understood that another module or structure in the mobile phone may also be connected to the middle frame 120 by using the circuit board 100, to implement efficient heat dissipation of the module or structure inside the electronic device.

Figure 3:
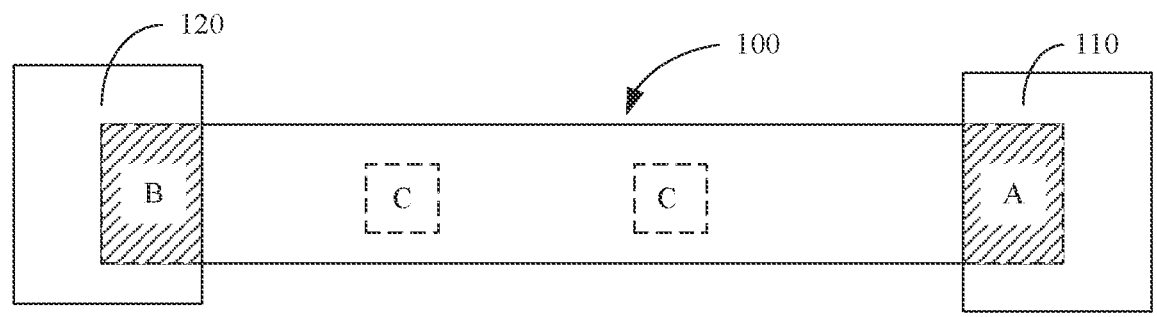
FIG. 3 is another schematic application diagram of a circuit board in the electronic device shown in FIG. 1.

Further, in electronic devices according to some other embodiments of this application, a third module may be further disposed between the first module and the second module, the circuit board passes through the third module and is attached to the third module, and the circuit board is configured to transfer heat of the first module and the third module to the second module. Referring to FIG. 3, in some embodiments of this application, a high temperature zone A is correspondingly formed at a position at which the first module is connected to the circuit board, a low temperature zone B is formed at a position at which the second module corresponds to the circuit board, and a second high temperature zone C is formed at a position at which the third module is attached to the circuit board. The circuit board 100 can transfer heat in both the high temperature zone A and the second high temperature zone C to the low temperature zone B, to better resolve a problem of excessively high local heat in the electronic device. For example, when the camera module 110 in the embodiment of FIG. 1 is connected to the middle frame 120, a heating element is covered, and a second high temperature zone C is formed at a position at which the heating element is in contact with the circuit board 100.

In this application, the high temperature zone A and the low temperature zone B are not specific zones that actually exist. When a module or a structure with a relatively large amount of heat is connected to a position of the circuit board 100, and a module or a structure with a relatively small amount of heat or no heat is connected to another position of the circuit board 100, a high temperature zone A is formed at the position at which the circuit board 100 is connected to the module or the structure with a relatively large amount of heat, and a low temperature zone B is formed at the position at which the circuit board 100 is connected to the module or the structure with a relatively small amount of heat or no heat. In actual product design, positions of the low temperature zone B and the high temperature zone A may be changed based on an actual situation. For example, when a module disposed in a zone is in a working state, an amount of heat is relatively large, and at this moment, a high temperature zone A is formed in a circuit board zone connected to the module. When the module is in a non-working state, the module does not generate heat, and at this moment, a low temperature zone B is formed in the zone in which the module is located.

Figure 4:
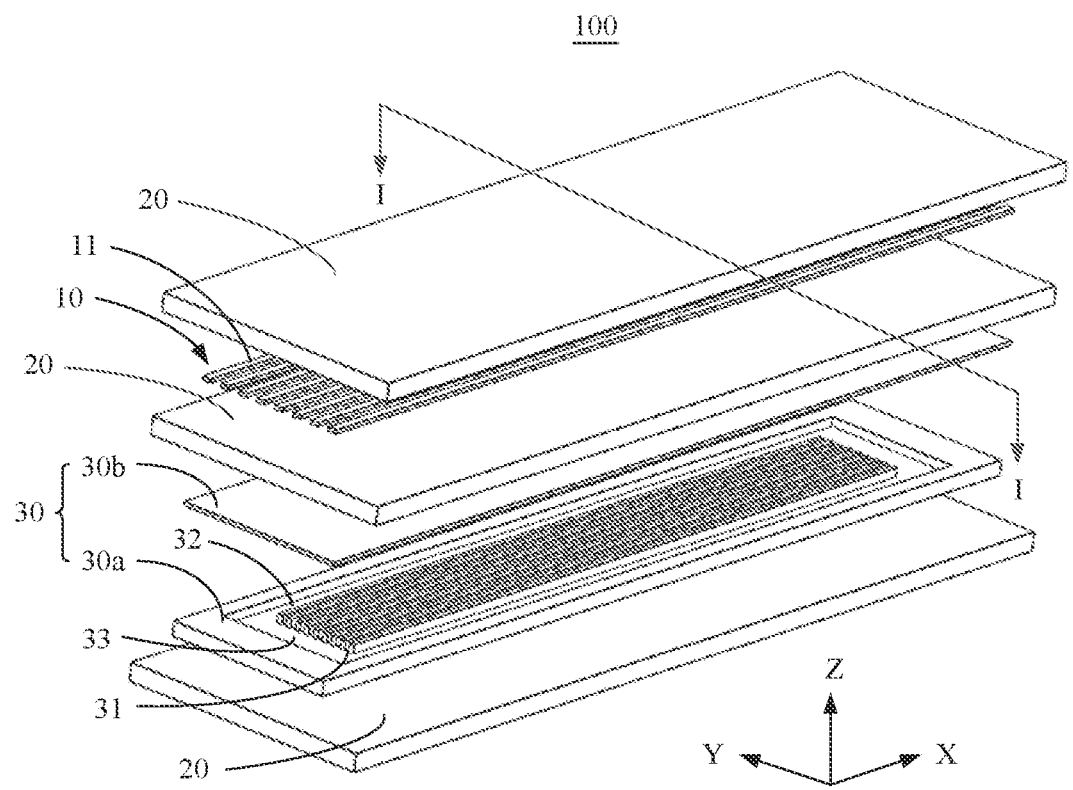
FIG. 4 is an exploded diagram of a circuit board according to a first embodiment of this application.
Figure 5:
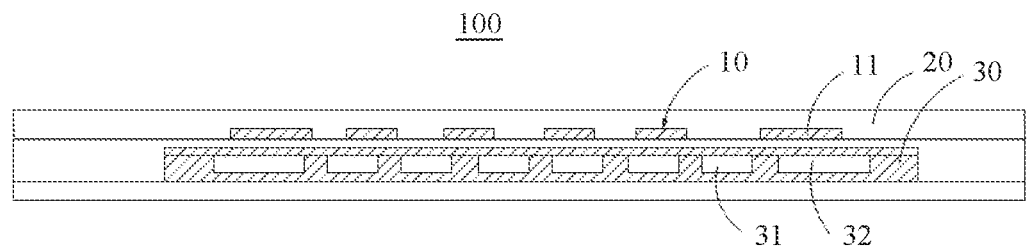
FIG. 5 is a schematic cross-sectional diagram of a circuit board along an I-I direction according to the embodiment shown in FIG. 4.

FIG. 4 and FIG. 5 show a circuit board 100 according to an embodiment of this application. The circuit board 100 includes a signal layer 10, an insulation layer 20, and a thermally conductive layer 30 that are disposed in a stacked manner. The signal layer 10 is separated from the thermally conductive layer 30 by using the insulation layer 20, to prevent the thermally conductive layer 30 from affecting signal transmission on the signal layer 10.

In different embodiments, the insulation layer 20 is made of different materials. For example, when the circuit board 100 is an FPC, the insulation layer 20 is a polyimide film (polyimide film, PI) and when the circuit board 100 is a PCB, the insulation layer 20 is a board of various types, such as a fiberglass cloth substrate or a fiberglass and paper composite substrate.

In this embodiment, an insulation layer 20 is further disposed on a side that is of the signal layer 10 and that is away from the thermally conductive layer 30, and an insulation layer 20 is further disposed on a side that is of the thermally conductive layer 30 and that is away from the signal layer 10. In other words, outermost layers of the circuit board 100 are all insulation layers 20. In this way, the insulation layers 20 protect the signal layer 10 and the thermally conductive layer 30 located inside the outermost insulation layers 20, to prevent external water, oxygen, and the like from affecting normal working of the signal layer 10 and the thermally conductive layer 30.

The signal layer 10 includes a plurality of signal cables 11 that are disposed at intervals. The signal cables 11 are configured to connect modules or structures located at both ends of the circuit board 100, to implement an electrical connection between modules or structures on both sides of the circuit board 100. In this embodiment, there is one signal layer 10. It may be understood that, in other embodiments of this application, there may be a plurality of signal layers 10, the plurality of signal layers 10 are disposed in a stacked manner, and adjacent signal layers 10 are separated by using an insulation layer 20, to avoid mutual impact between the signal layers 10.

In this embodiment, the circuit board 100 is a thin slice structure. A length direction of the circuit board 100 is an extension direction of the signal cables 11 (a direction shown by an arrow X in FIG. 4). A width direction of the circuit board 100 (a direction shown by an arrow Y in FIG. 4) is perpendicular to the length direction. A thickness direction of the circuit board 100 (a direction shown by an arrow Z in FIG. 4) is a stacking direction of the signal layer 10, the insulation layer 20, and the thermally conductive layer 30 in the circuit board 100, and is perpendicular to both the length direction and the thickness direction. A length direction, a width direction, and a thickness direction of the thermally conductive layer 30 are the same as the length direction, the width direction, and the thickness direction of the circuit board 100. The thermally conductive layer 30 includes one group of flow passageways or a plurality of groups of flow passageways. A high temperature zone A and a low temperature zone B are respectively located at both ends of each group of flow passageways, to transfer heat in the high temperature zone A to the low temperature zone B by using the flow passageways, thereby implementing efficient heat dissipation in an electronic device. In this embodiment, the thermally conductive layer 30 includes one group of flow passageways. In some other embodiments of this application, the thermally conductive layer 30 has a plurality of groups of flow passageways, and the plurality of groups of flow passageways are disposed at intervals in the length direction of the circuit board 100.

Each group of flow passageways includes a first flow passageway 31 and a second flow passageway 32 that are disposed at intervals in the width direction of the circuit board 100, and connecting flow passageways 33 that are disposed at both ends of the first flow passageway 31 and the second flow passageway 32. Both the first flow passageway 31 and the second flow passageway 32 extend along the length direction of the circuit board 100, and the first flow passageway 31 and the second flow passageway 32 are connected by using the connecting flow passageways 33 at both ends of the first flow passageway 31 and the second flow passageway 32. Specifically, the first flow passageway 31 and the second flow passageway 32 each include a first end and a second end opposite to the first end. The first end of each first flow passageway 31 and the first end of each second flow passageway 32 are located on a same side and are connected to each other by using a connecting flow passageway 33 located on that side. The second end of each first flow passageway 31 and the second end of each second flow passageway 32 are located on one side and are connected to each other by using a connecting flow passageway 33 located on that side. When the thermally conductive layer 30 includes a plurality of groups of flow passageways, connecting flow passageways 33 between two adjacent groups of flow passageways are connected to each other. In this embodiment, the thermally conductive layer 30 has a plurality of first flow passageways 31 and a plurality of second flow passageways 32. Specifically, in this embodiment, there are eight first flow passageways 31 and two second flow passageways 32, and the plurality of first flow passageways 32 are located between the two second flow passageways 32. It may be understood that, in other embodiments of this application, a second flow passageway 32 may alternatively be disposed between any two adjacent first flow passageways 31. In addition, quantities of the first flow passageways 31 and the second flow passageways 32 on the thermally conductive layer 30 may be correspondingly adjusted and changed based on an actual requirement and a size of the circuit board 100. For example, when a relatively large amount of heat needs to be transferred and the size of the circuit board 100 permits, the quantities of the first flow passageway 31 and the second flow passageway 32 may be further increased. When a relatively small amount of heat needs to be transferred or the size of the circuit board 100 is relatively small, the quantity of the first flow passageways 31 and the quantity of the second flow passageways 32 may be further reduced, or may be even one.

In this application, a cooling medium is filled in closed space formed by the first flow passageway 31, the second flow passageway 32, and the connecting flow passageways 33. In this embodiment, the cooling medium is water, which has advantages such as low cost and environmental protection. The first flow passageway 31 has capillary force, so that the cooling medium in a liquid state can flow in the first flow passageway 31 under the action of the capillary force. A cross-sectional area of the second flow passageway 32 is greater than a cross-sectional area of the first flow passageway 31. The second flow passageway 32 does not have capillary force, and resistance suffered by the cooling medium in a vapor state in the second flow passageway 32 is less than that in the first flow passageway 31, so that the cooling medium in the vapor state chooses to flow in the second flow passageway 32 with relatively small flow resistance. In this embodiment, the cross-sectional area of the first flow passageway 31 is about $5 \times 10^{-5}$ mm$^2$ to 10 mm$^2$. A percentage of a space volume occupied by the cooling medium in the liquid state in a total space volume of the first flow passageway 31, the second flow passageway 32, and the connecting flow passageway 33 is about 0.1% to 50%, to achieve a better vapor-liquid circulation effect and implement more efficient heat transfer.

When a high temperature zone A and a low temperature zone B are respectively formed on the circuit board 100 at both ends of the first flow passageway 31 and/or at both ends of the second flow passageway 32, the cooling medium absorbs heat and vaporizes to the vapor state in the high temperature zone A, the cooling medium in the vapor state flows in the second flow passageway 32 to the low temperature zone B and is liquefied to the liquid state in the low temperature zone B, and the cooling medium in the liquid state flows in the first flow passageway 31 to the high temperature zone A under a capillary action. The cooling medium circulates between the high temperature zone A and the low temperature zone B, so that heat in the high temperature zone A is carried to the low temperature zone B, thereby resolving a problem of an excessively high local temperature. In some embodiments, a module connected to the low temperature zone B on the circuit board 100 is a heat dissipation module, and has a heat dissipation function. In this case, heat in the high temperature zone A can be carried to the low temperature zone B by using the circuit board 100, and the heat is dissipated by using the heat dissipation module at a position corresponding to the low temperature zone B. In this way, the heat in the high temperature zone of the electronic device is dissipated, thereby implementing more efficient heat dissipation of the electronic device.

Figure 6:
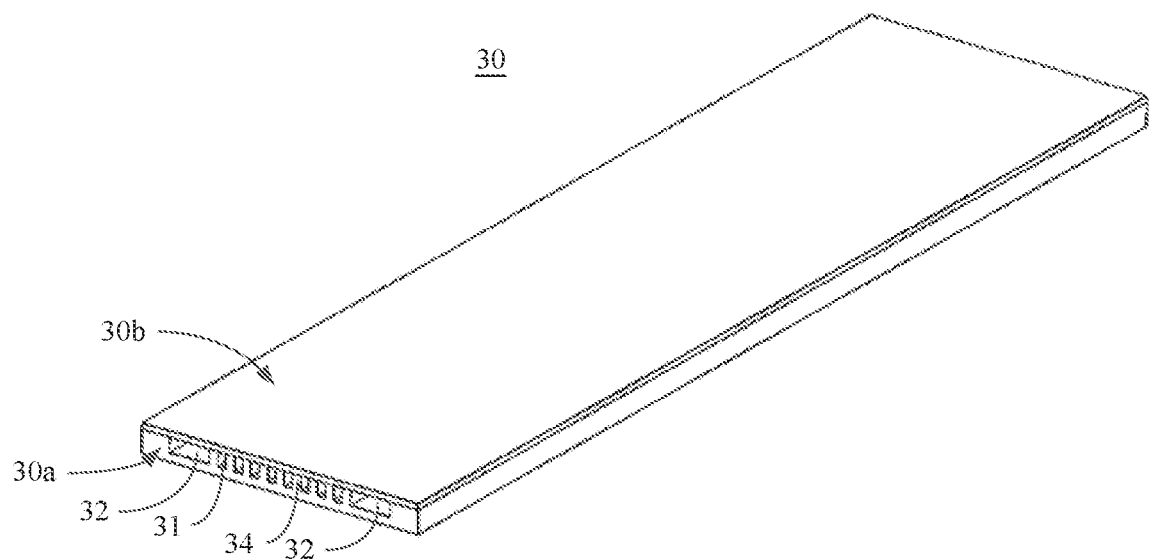
FIG. 6 is a schematic structural diagram of a thermally conductive layer in the circuit board according to the embodiment shown in FIG. 4 after a part of the thermally conductive layer is cut along an I-I direction.
Figure 7:
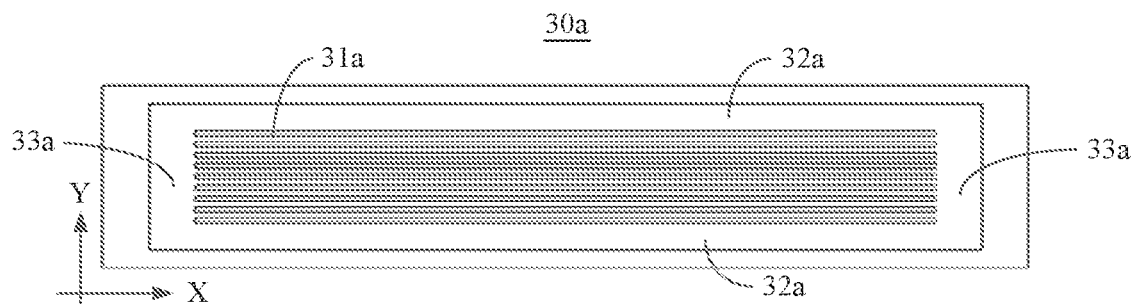
FIG. 7 is a schematic structural diagram of a first metal layer of a thermally conductive layer according to a first embodiment of this application.

FIG. 6 is a schematic structural diagram of a thermally conductive layer 30 according to an embodiment of this application. FIG. 7 is a schematic structural diagram of a first metal layer 30a according to the embodiment shown in FIG. 6. In this embodiment, the thermally conductive layer 30 includes a first metal layer 30a disposed in a stacked manner in a thickness direction of a circuit board 100 and a second metal layer 30b stacked on the first metal layer 30a. A groove pattern is disposed on the first metal layer 30a, and the groove pattern includes a first groove 31a, a second groove 32a, and connecting grooves 33a at both ends of the first groove 31a and the second groove 32a. The second metal layer 30b is stacked on the first metal layer 30a, seals the first groove 31a to obtain a first flow passageway 31, seals the second groove 32a to obtain a second flow passageway 32, and seals the connecting grooves 33a to obtain connecting flow passageways 33. Further, because a thickness of the circuit board 100 is relatively thin, thicknesses of a signal layer 10, an insulation layer 20, and the thermally conductive layer 30 cannot be excessively thick, to avoid increasing the thickness of the circuit board 100. In this embodiment, both a thickness of the thermally conductive layer 30 and a thickness of the signal layer 10 are about 0.01 mm to 1 mm. Depths of the first flow passageway 31, the second flow passageway 32, and the connecting flow passageway 33 are less than the thickness of the thermally conductive layer 30, and are about 0.005 mm to 1 mm. A thickness of the insulation layer 20 is about 0.01 mm to 1 mm. In addition, because the first flow passageway 31, the second flow passageway 32, and the connecting flow passageway 33 are all embedded in the thermally conductive layer 30, depths of the first flow passageway 31, the second flow passageway 32, and the connecting flow passageway 33 need to be less than the thicknesses of the thermally conductive layer 30.

In this embodiment, a support strip 34 is formed between adjacent grooves (two adjacent first grooves 31a or a first groove 31a and a second groove 32a that are adjacent to each other), to separate the adjacent grooves by using the support strip 34 and support the second metal layer 30b. In this embodiment, a width of the support strip 34 (that is, a distance between two adjacent grooves) is about 0.01 mm to 10 mm, so that a support strength requirement is satisfied, to withstand some pressure from the thickness direction of the circuit board 100, and prevent the support strip 34 from occupying excessive space.

Figure 8:
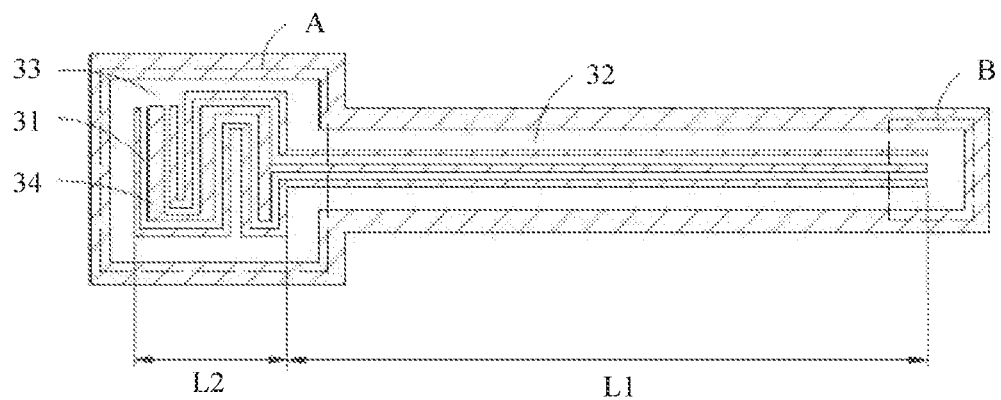
FIG. 8 is a schematic diagram of an internal structure of a thermally conductive layer according to a second embodiment of this application.

In addition, there is a specific distance between an edge of the first metal layer 30a and an outermost groove, to prevent an external object from damaging the flow passageway from a side wall of the thermally conductive layer 30. In this embodiment, the distance between the edge of the first metal layer 30a and the outermost groove is about 0.1 mm to 10 mm. In this embodiment, the first flow passageway 31 and the second flow passageway 32 are straight flow passageways disposed in parallel. It may be understood that, in other embodiments of this application, the first flow passageway 31 and the second flow passageway 32 may alternatively be any curved flow passageways such as flow passageways of a wave type or a broken line type, or may be partially curved flow passageways, to meet an actual use requirement. For example, when the circuit board 100 is a curved circuit board, the first flow passageway 31 and the second flow passageway 32 can be disposed along an extension direction of the circuit board 100. In addition, by configuring the first flow passageway 31 or the second flow passageway 32 as a curved flow passageway or a partially curved flow passageway, a length of the flow passageway can be increased when a length of the circuit board 100 is fixed, and a cooling medium can stay in a high temperature zone A or a low temperature zone B for a relatively long time, to achieve a better heat transfer effect. For example, as shown in FIG. 8, in an embodiment of this application, the first flow passageway 31 includes a straight flow section L1 and a curved flow section L2 connected to the straight flow section L1, and the curved flow section L2 is located at one end of the first flow passageway 31, In this embodiment, a high temperature zone A is formed at a position corresponding to the curved flow section L2. Because the first flow passageway 31 corresponding to the position of the high temperature zone A is a curved flow passageway, the cooling medium in a liquid state in the first flow passageway 31 can flow in the high temperature zone A for a relatively long time, to absorb more heat. It may be understood that, in other embodiments of this application, the curved flow section L2 may alternatively be located at another position of the first flow passageway 31, so that the cooling medium in the first flow passageway 31 stays at the position for a relatively long time, to absorb more heat at the position and transfer the heat to the low temperature zone, so that the circuit board 100 has a better heat transfer effect.

Figure 9:
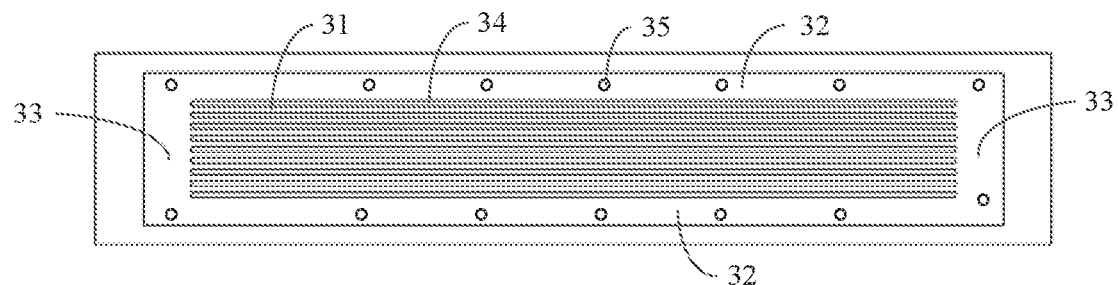
FIG. 9 is a schematic diagram of an internal structure of a thermally conductive layer according to a third embodiment of this application.

Further, referring to FIG. 9, in some embodiments of this application, a plurality of support pillars 35 are disposed at intervals in the second flow passageway 32. One end of the support pillar 35 is fastened to a bottom wall of the second flow passageway 32, the other end of the support pillar 35 extends along the thickness direction of circuit board 100 toward a top wall of the second flow passageway 32, and the other end of the support pillar 35 abuts the top wall of the second flow passageway 32, or a small gap is formed between the other end of the support pillar 35 and the top wall of the second flow passageway 32. In this way, the second flow passageway 32 is prevented from being damaged when the circuit board 100 is subjected to pressure in the thickness direction. The bottom wall of the second flow passageway 32 is a bottom surface of the second groove 32a etched on the first metal layer 30a, and the top wall of the second flow passageway 32 is a surface that is of the second metal layer 30b and that faces the first metal layer 30a. In this embodiment, a volume of the support pillar 35 is relatively small, and movement of vapor in the second flow passageway 32 is not affected.

Further, in some embodiments of this application, some capillary force enhancing structures may be disposed in the first flow passageway 31, to enhance capillary force of the first flow passageway 31. In some embodiments, the capillary force enhancing structure may be a capillary structure sintered by a copper mesh or copper powder.

Figure 10:
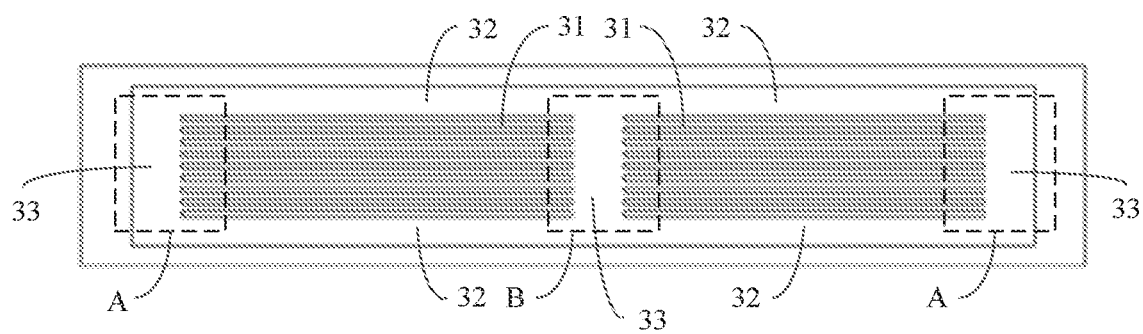
FIG. 10 is a schematic diagram of an internal structure of a thermally conductive layer according to a fourth embodiment of this application.

FIG. 10 is a thermally conductive layer 40 according to another embodiment of this application. A difference between a structure of the thermally conductive layer 40 in this embodiment and a structure of the thermally conductive layer 30 lies in that the thermally conductive layer 40 has two groups of flow passageways, and the two groups of flow passageways are disposed at intervals in a length direction of a circuit board 100. Quantities of first flow passageways 31 in the two groups of flow passageways may be the same or different, and second flow passageways 32 in the two groups of flow passageways may be the same or different. Connecting flow passageways 33 between the two groups of flow passageways are connected. In this embodiment, a high temperature zone A and a low temperature zone B are respectively formed at both ends of each group of flow passageways. Specifically, in this embodiment, a low temperature zone B is formed at a position between two adjacent groups of flow passageways, high temperature zones A are formed at ends that are of the two groups of flow passageways and that are away from the low temperature zone B, and heat of the two high temperature zones A is transferred to the low temperature zone B separately by using a corresponding group of flow passageways, so that heat at two different positions can be transferred to a same low temperature zone by using one circuit board 100. It may be understood that, in other embodiments of this application, a high temperature zone A may alternatively be disposed at a position between two adjacent groups of flow passageways, and ends that are of the two groups of flow passageways and that are away from the high temperature zone A are both low temperature zones B, so that heat in the high temperature zone A can be simultaneously transferred to the two low temperature zones B, to achieve a better heat transfer or heat dissipation effect.

Figure 11:
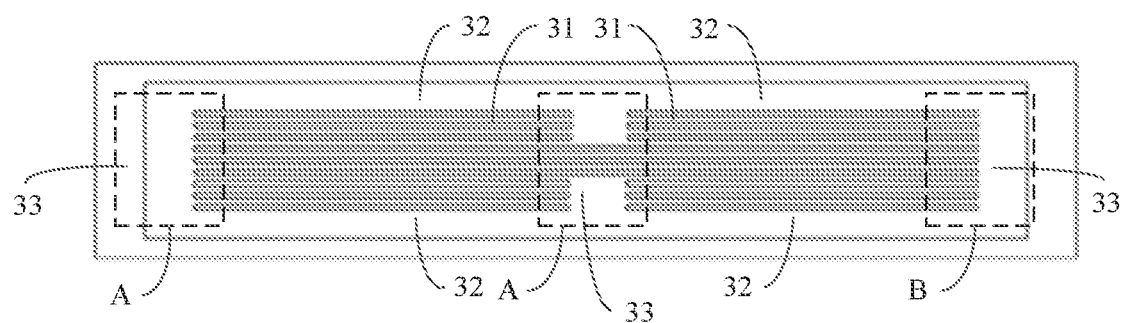
FIG. 11 is a schematic diagram of an internal structure of a thermally conductive layer according to a fifth embodiment of this application.
Figure 12:
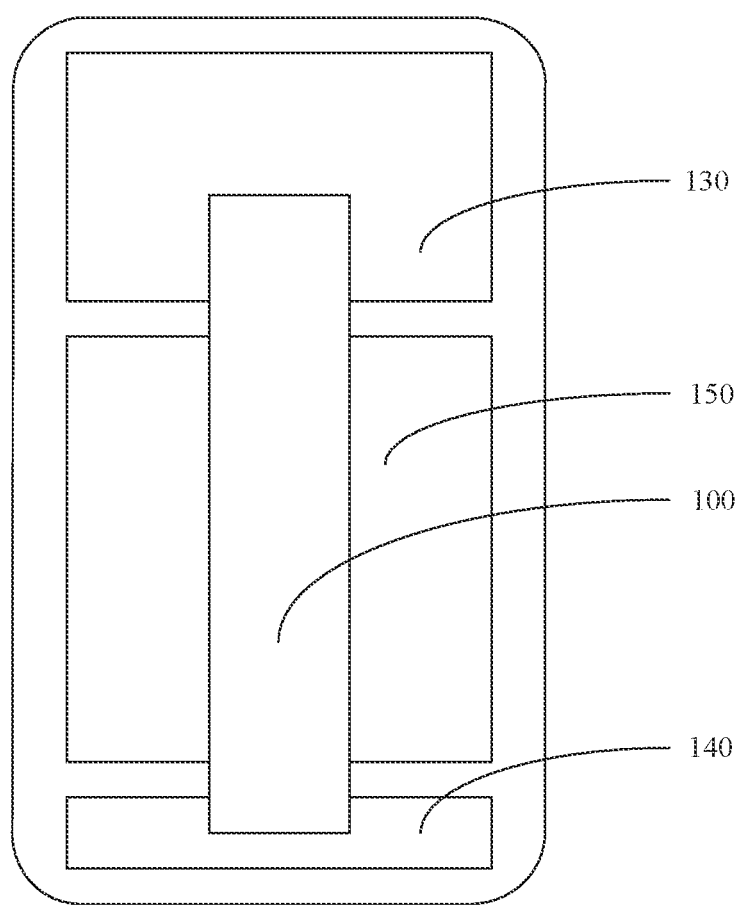
FIG. 12 is a schematic structural diagram of an electronic device according to another embodiment of this application.

Further, referring to FIG. 11, another embodiment of this application provides a thermally conductive layer 50. A difference between the thermally conductive layer 50 and the thermally conductive layer 40 lies in that some first flow passageways 31 in the two groups of flow passageways may be connected by using a connecting flow passageway 33 between the two groups of flow passageways. In actual application of a circuit board including the thermally conductive layer 50, because there are the first flow passageways 31 connecting the two groups of flow passageways, heat can be transferred between two ends that are of the two groups of flow passageways and that are away from each other. In addition, because there are also flow passageways disposed at intervals in a length direction, a case in which heat flows from a position between the two groups of flow passageways to the two ends that are of the two groups of flow passageways and that are away from each other can be further implemented, or a case in which heat flows from the two ends that are of the two groups of flow passageways and that are away from each other to a position between the two groups of flow passageways can be implemented. For example, in this embodiment, a zone between the two groups of flow passageways is configured as a high temperature zone A, and the two ends that are of the two groups of flow passageways and that are away from each other are respectively configured as a high temperature zone A and a low temperature zone B. In other words, two high temperature zones A and one low temperature zone B are disposed on the thermally conductive layer 50. When a module or a structure carried on any high temperature zone A generates heat, the heat of the any high temperature zone A can be transferred to the low temperature zone B. Alternatively, in some other embodiments of this application, a zone between the two groups of flow passageways may be configured as a high temperature zone A, and low temperature zones B are formed at the two ends that are of the two groups of flow passageways and that are away from each other, so that heat in the high temperature zone A can be transferred to the low temperature zones B on both sides. It may be understood that, in some other embodiments of this application, a low temperature zone B or a high temperature zone A may be selected based on an actual situation to be formed in the zone between the two groups of flow passageways and at the two ends that are of the two groups of flow passageways and that are away from each other. For example, FIG. 12 is a schematic structural diagram of an electronic device according to an embodiment of this application. The electronic device is a mobile phone, and includes a mainboard 130 located in an upper part of the mobile phone, a small board 140 located in a lower part of the mobile phone, and a battery module 150 located between the mainboard 130 and the small board 140. The mainboard 130 and the small board 140 are electrically connected by using a circuit board 100 including a thermally conductive layer 50, and the circuit board 100 covers the battery module 150 located between the mainboard 130 and the small board 140. In other words, two ends of the circuit board 100 respectively correspond to two ends that are of two groups of flow passageways and that are away from each other, and the battery module 150 corresponds to a position between the two groups of flow passageways. When the mobile phone is used, the mainboard 130 generates a relatively large amount of heat, so that a high temperature zone A is formed on the circuit board 100 at a position corresponding to the mainboard 130; and the small board 140 generates a relatively small amount of heat, so that a low temperature zone B is formed on the circuit board 100 at a position corresponding to the small board 140. In this case, the circuit board 100 can transfer heat of the mainboard 130 to the small board 140, to avoid excessively high heat at the position of the mainboard 130. When the mobile phone is charged, the battery module 150 generates heat, so that a high temperature zone A is formed on the circuit board 100 at a position corresponding to the battery module 150; and heat generated by the mainboard 130 and the small board 140 is less than heat generated by the battery module 150, so that low temperature zones B are formed on the circuit board 100 at positions corresponding to the mainboard 130 and the small board 140. In this case, the circuit board 100 can transfer heat generated by the battery module 150 to the mainboard 130 and the small board 140, to avoid excessively high heat of the battery module 150.

Figure 13:
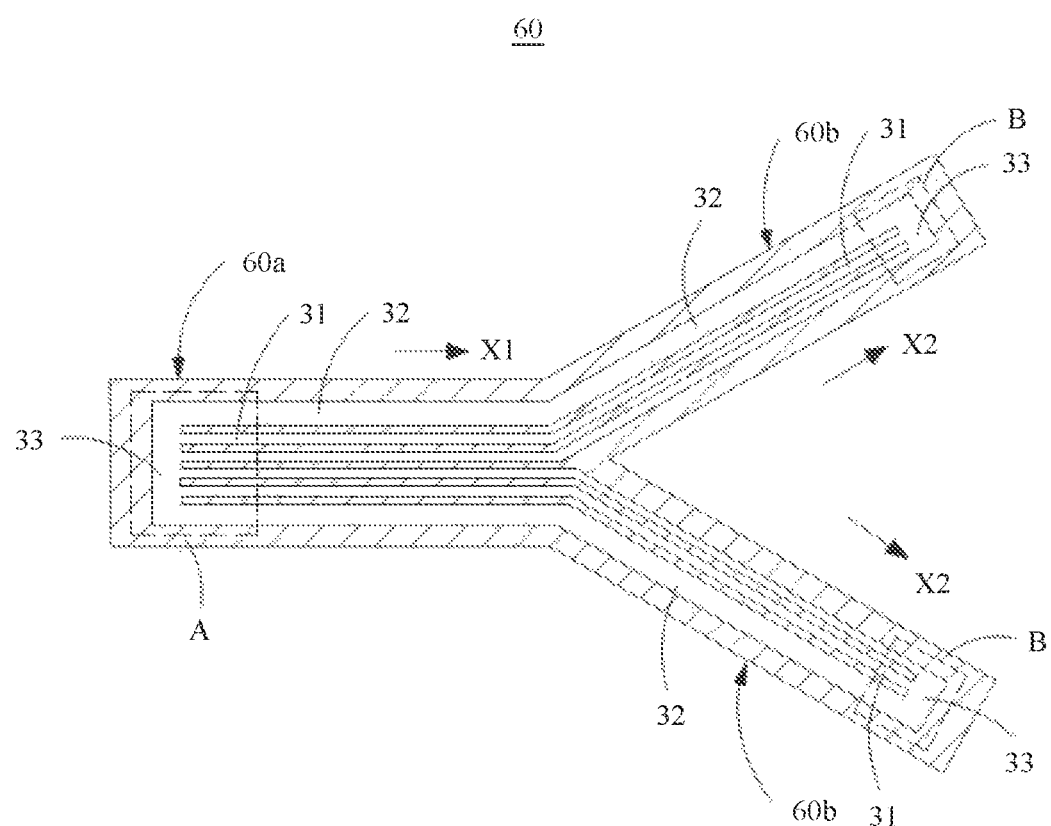
FIG. 13 is a schematic diagram of an internal structure of a thermally conductive layer according to a sixth embodiment of this application.

Further, in this application, a shape structure of a thermally conductive layer may be correspondingly changed based on a structural shape of a circuit board, and may be a regular strip shape, or may be another special shape. For example, when the circuit board has bifurcated branches, corresponding branches may also be formed in a shape of the thermally conductive layer. Specifically, referring to FIG. 13, another embodiment of this application provides a thermally conductive layer 60. The thermally conductive layer 60 includes a main flow passageway 60a and two branch flow passageways 60b connected to the main flow passageway 60a. In this embodiment, a length direction of a circuit board is still the same as an extension direction of a signal cable 11, but corresponding to different positions of the circuit board, length directions of the circuit board are different. For example, corresponding to a position of the main flow passageway 60a, the length direction of the circuit board is an X1 direction shown in FIG. 13. Corresponding to a position of one of the two branch flow passageways 60b, the length direction of the circuit board is an X2 direction shown in FIG. 13. Corresponding to a position of the other one of the two branch flow passageways 60b, the length direction of the circuit board is an X3 direction shown in FIG. 13. It may be understood that, in other embodiments of this application, there may be more than two branch flow passageways 60b. The length direction of the circuit board varies accordingly with different positions. At least one first flow passageway 31 and at least one second flow passageway 32 are disposed on each branch flow passageway 60b, and all first flow passageways 31 and all second flow passageways 32 on the branch flow passageways 60b extend to the main flow passageway 60a. At least one first flow passageway 31 and at least one second flow passageway 32 are disposed on the main flow passageway 60a. In these embodiments, heat can be transferred from the main flow passageway 60a to each branch flow passageway 60b or from each branch flow passageway 60b to the main flow passageway 60a, to satisfy some specific conditions in actual use. For example, in this embodiment, a high temperature zone A may be disposed at one end that is of the main flow passageway 60a and that is away from the branch flow passageway 60b, and a low temperature zone B may be disposed at one end that is of each branch flow passageway 60b and that is away from the main flow passageway 60a. In this way, heat of a module or a structure carried in the high temperature zone A can be dispersed to two low temperature zones B, so that heat of the high temperature zone A can be better dissipated, and heat of various positions of the electronic device can be more evenly distributed. Alternatively, in some embodiments, a low temperature zone B may be disposed at one end that is of the main flow passageway 60a and that is away from the branch flow passageway 60b, and a high temperature zone A may be disposed at one end of each branch flow passageway 60b. In this way, heat of modules or structures carried in different high temperature zones A can be transferred to a same low temperature zone B, to satisfy an actual requirement.

In some embodiments of this application, a circuit board further includes a signal shield layer stacked with a signal layer 10 and a thermally conductive layer 30. The signal shield layer is separated from the signal layer 10 by using an insulation layer 20, and an external signal is shielded by using the signal shield layer, thereby preventing the external signal from affecting signal transmission at the signal layer 10.

Figure 14:
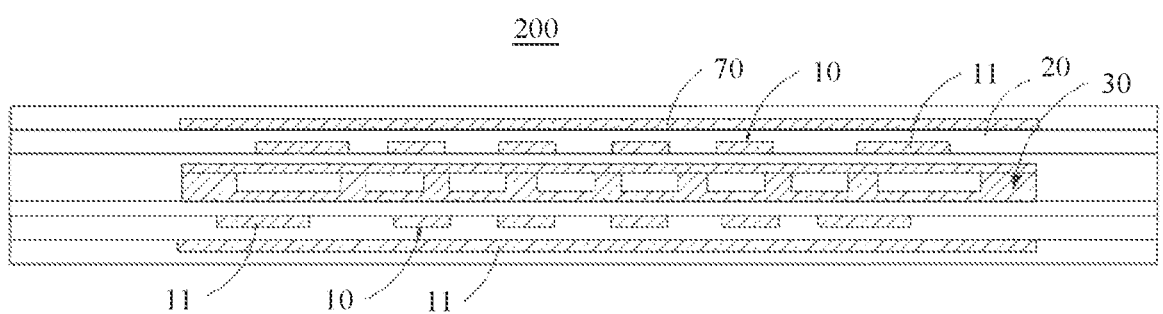
FIG. 14 is a schematic cross-sectional diagram of a circuit board according to a second embodiment of this application along an I-I direction of the circuit board according to the embodiment shown in FIG. 4.

Referring to FIG. 14, a circuit board 200 according to an embodiment of this application includes a thermally conductive layer 30, two signal layers 10, and two signal shield, Layers 70. All signal layers 10 are located between the two signal shield layers 70, to shield an external signal by using the signal shield layers 70, thereby preventing the external signal from affecting signal transmission al the signal layers 10. It may be understood that the thermally conductive layer of the circuit board 200 may alternatively be the thermally conductive layer in another embodiment of this application. The thermally conductive layer 30 is located between the two signal layers 10, and is separated from the signal layers 10 by an insulation layer 20. It may be understood that, in some other embodiments of this application, there may alternatively he one or more thermally conductive layers 30, which may be changed based on an actual requirement. The thermally conductive layer 30 may be located at any layer of the circuit board 100.

Further, in some embodiments of this application, relative to the signal layer 10, the thermally conductive layer 30 is disposed close to a surface of the circuit board, so that the thermally conductive layer 30 is closer to a heat source in a high temperature zone A, a heat dissipation structure in a low temperature zone B, or the like than the signal layer 10. In this way, heat transfer or dissipation is implemented more efficiently. In addition, because the thermally conductive layer 30 is made of a metal material, the thermally conductive layer 30 also has a signal shielding function. Therefore, when the thermally conductive layer 30 is disposed close to the surface of the circuit board, that is, the thermally conductive layer 30 is closer to the surface of the circuit board than the signal layer 10, the thermally conductive layer 30 can also implement a signal shielding function, to reduce or avoid setting of the signal shield layer in the circuit board, and further reduce a thickness of the circuit board when achieving good thermal conduction efficiency and a signal transmission function of the circuit hoard.

Figure 15:
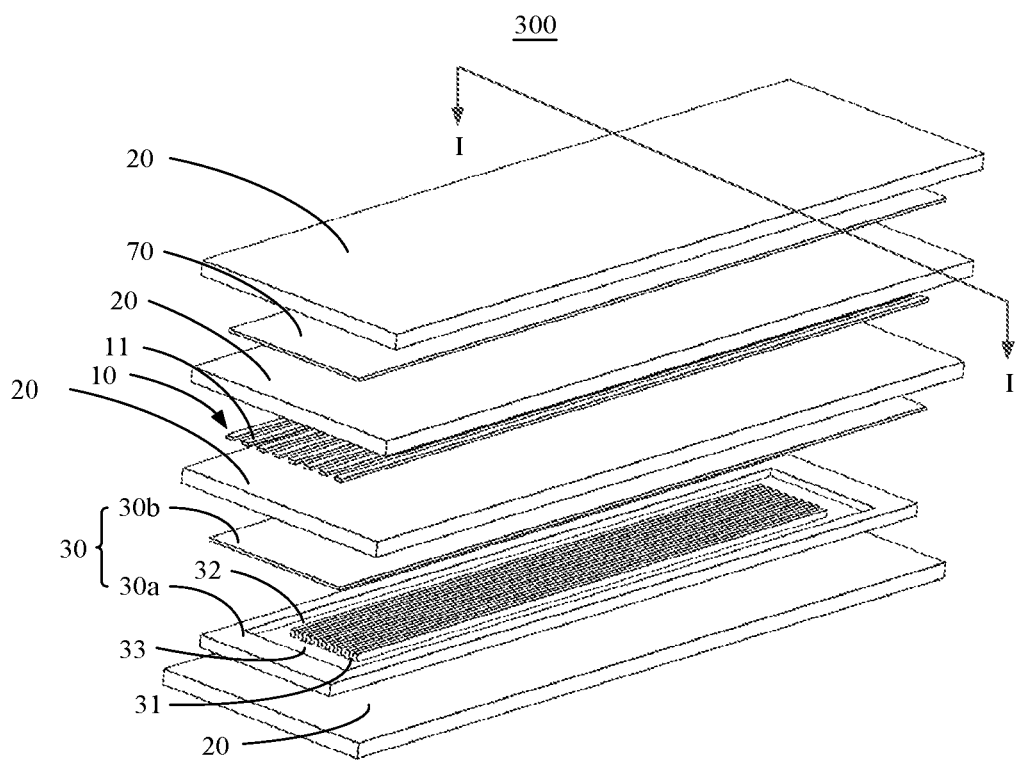
FIG. 15 is an exploded diagram of a circuit board according to a third embodiment of this application.
Figure 16:
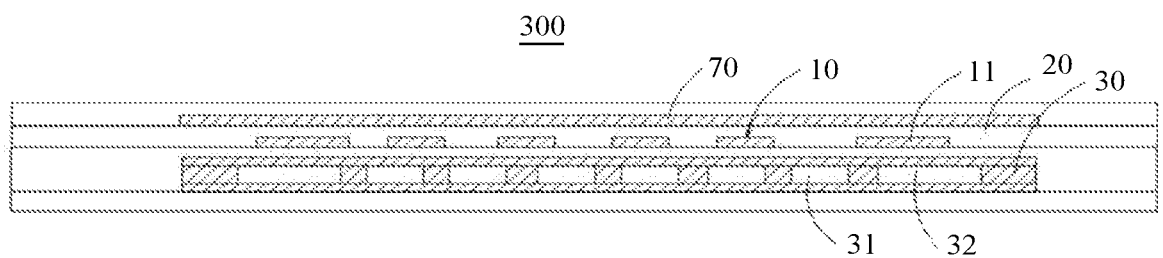
FIG. 16 is a schematic cross-sectional diagram of a circuit board along air I-I direction according to the embodiment shown in FIG. 15.

For example, referring to FIG. 15 and FIG. 16, this application provides a circuit hoard 300. The circuit board 300 has one signal layer 10, one thermally conductive layer 30, and one signal shield layer 70. The signal layer 10, the thermally conductive layer 30, and the signal shield layer 70 are separated from each other by using insulation layers 20. It should be emphasized that the signal layer 10 needs to be separated, by using an insulation layer 20, from a layer structure (such as the thermally conductive layer 30 and the signal shield layer 70) formed by any metal material, to prevent another layer structure from affecting signal transmission at the signal layer 10. It may be understood that the thermally conductive layer of the circuit board 300 may alternatively be the thermally conductive layer in another embodiment of this application. The signal shield layer 70 and the thermally conductive layer 30 are respectively located on both sides of the signal layer 10, to shield an external signal by using the signal shield layer 70 and the thermally conductive layer 30, thereby preventing the external signal from affecting the signal layer 10. Further, relative to the signal layer 10, the thermally conductive layer 30 is disposed close to a heating module, so that the thermally conductive layer 30 is closer to a heat source. In this way, heat transfer or dissipation is implemented more efficiently. In this embodiment, an insulation layer 20 is disposed on a surface that is of the thermally conductive layer 30 and that is away from the signal layer 10, to protect the thermally conductive layer 30 by using the insulation layer 20, thereby preventing the thermally conductive layer 30 from being damaged by external water, oxygen, and the like. In addition, a surface that is of the insulation layer 20 and that is away from the thermally conductive layer 30 is an outer surface of the circuit board 300, so that the thermally conductive layer 30 can be as close as possible to the surface of the circuit board 300. It may be understood that, in other embodiments of this application, an insulation layer 20 is disposed on an outer surface of a layer structure that is formed by a metal material and that is located at an outermost layer, to prevent the layer structure from being damaged by external water, oxygen, and the like. Further, in this embodiment, a plurality of signal layers 30 may alternatively be disposed between the thermally conductive layer 30 and the signal shield layer 70, to enhance a signal transmission capability of the circuit board 300; or one or more thermally conductive layers 30 may be added between the thermally conductive layer 30 and the signal shield layer 70 in this embodiment, to enhance a thermal conduction capability of the circuit board 200. In addition, the plurality of thermally conductive layers 30 may be attached to each other. In other words, no insulation layer 20 needs to be disposed between adjacent thermally conductive layers 30.

In some embodiments of this application, when there is a plurality of thermally conductive layers in a circuit board, flow passageways (first flow passageways 31 or second flow passageways 32) of adjacent thermally conductive layers are disposed in a staggered manner. To be specific, an orthographic projection of a first flow passageway 31 or a second flow passageway 32 of one thermally conductive layer 30 on the other thermally conductive layer 30 is located at a position at which a support strip 34 of the other thermally conductive layer 30 is located, to prevent flow passageways of all thermally conductive layers 30 from being located at a same position in a thickness direction of the circuit board, thereby reducing impact of the thermally conductive layers on strength of the circuit board in the thickness direction.

Figure 17:
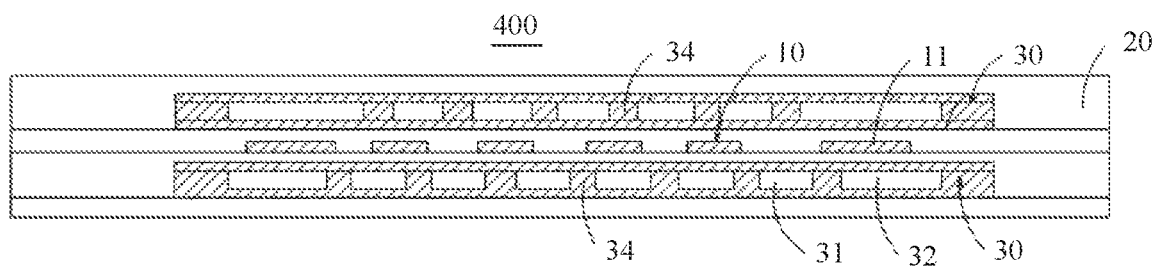
FIG. 17 is a schematic cross-sectional diagram of a circuit board according to a fourth embodiment of this application along an I-I direction of the circuit board according to the embodiment shown in FIG. 4.
Figure 18:
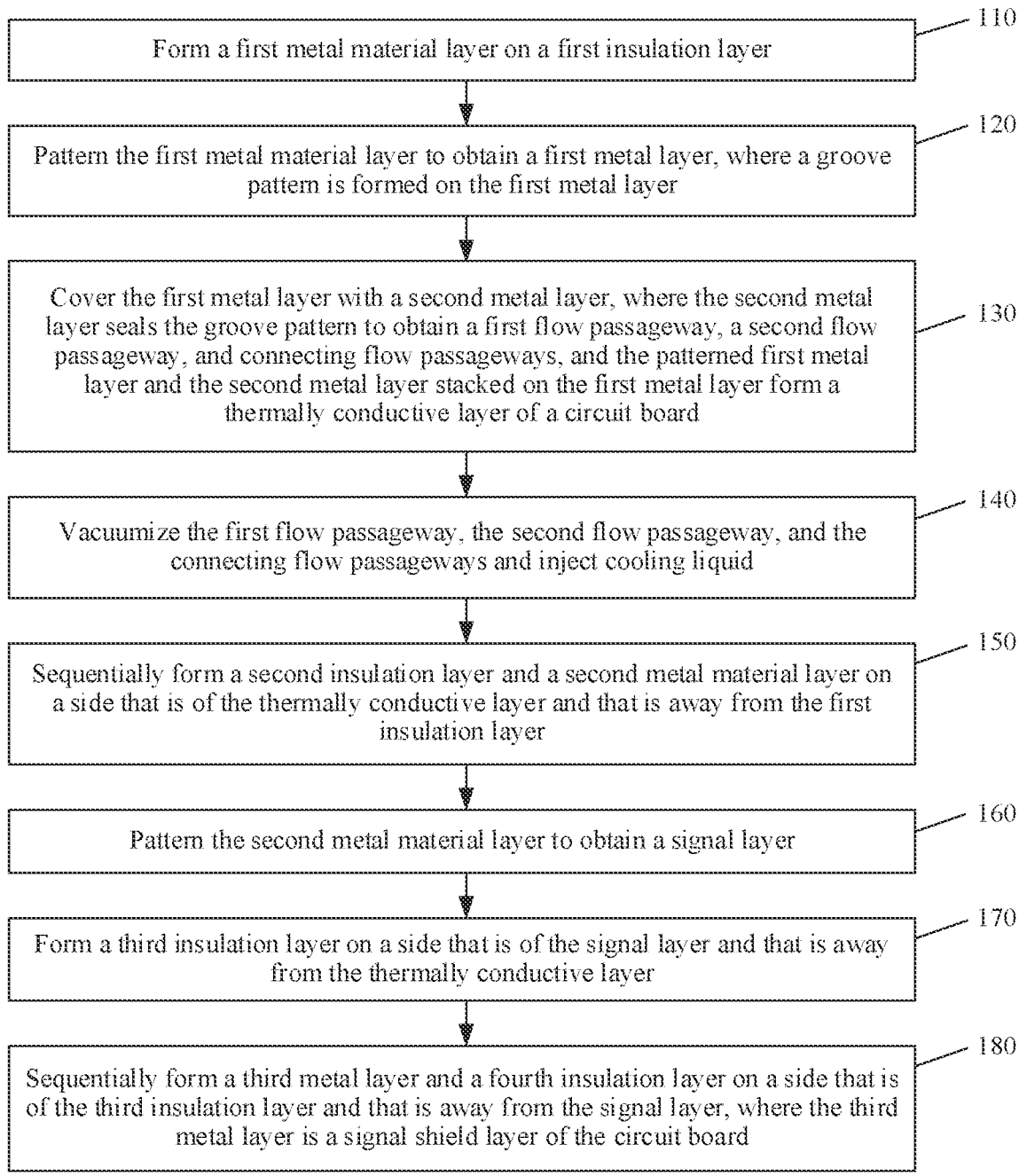
FIG. 18 is a flowchart of a method for manufacturing a circuit board according to a third embodiment of this application.
Figure 19A:
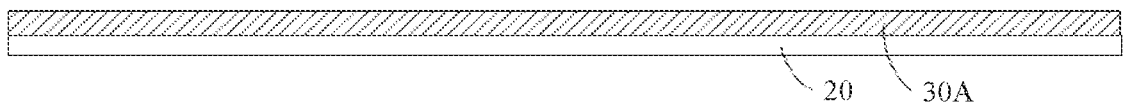
FIG. 19*a* to FIG. 19*e* are schematic cross-sectional diagrams of a circuit board in steps in the method for manufacturing a circuit board shown in FIG. 18.

For example, referring to FIG. 17, another embodiment of this application provides a circuit board 400. A difference between the circuit board 400 and the circuit board 300 lies in that the circuit board 400 has two thermally conductive layers 30. In other words, in this embodiment, one thermally conductive layer 30 is used to replace the signal shield layer 70 in the circuit hoard 300 shown in FIG. 16. The two thermally conductive layers 30 are respectively located on two sides of a signal layer 10. In other words, one thermally conductive layer 30 replaces the signal shield layer 70 in the circuit board 300. In this way, one thermally conductive layer 30 is added, to enhance thermal conduction efficiency of the circuit board 300 without greatly increasing a thickness of the circuit board 400. In this embodiment, at least some flow passageways of the two thermally conductive layers 30 are disposed in a staggered manner, to prevent the flow passageways from affecting strength of the circuit board 300 in a thickness direction. Referring to FIG. 18, this application further provides a method for manufacturing a circuit board 100, which specifically includes the following steps:

Step 110: Referring to FIG. 19a, form a first metal material layer 30A on a first insulation layer 20.

Figure 19B:
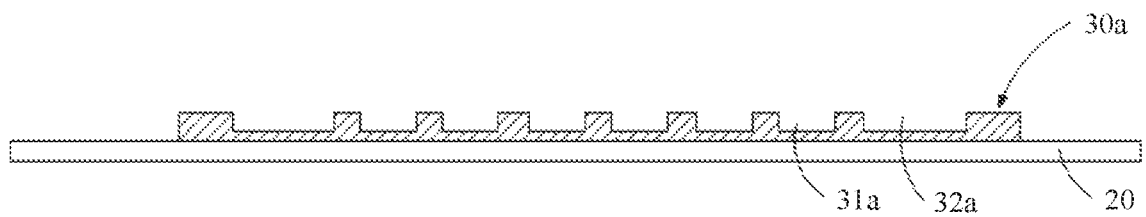

Step 120: Referring to FIG. 7 and FIG. 19b, pattern the first metal material layer 30A to obtain a first metal layer 30a.

A patterning technology includes processes such as exposure, development, and etching. A groove pattern is formed on the first metal layer 30a. The groove pattern includes a first groove 31a, a second groove 32a, and connecting grooves 33a. In this embodiment, there is a plurality of first grooves 31a and a plurality of second grooves 32a, and the first grooves 31a and the second grooves 32a are disposed in parallel; and there are two connecting grooves 33a, which are respectively located on both sides of the first grooves 31a and the second grooves 32a. A support strip 34 is formed between adjacent grooves (two first grooves 31a, or a first groove 31a and a second groove 32a). It may be understood that, in manufacturing of a circuit board in another embodiment of this application, a structure of the groove pattern varies with a different structure of a thermally conductive layer.

Figure 19C:
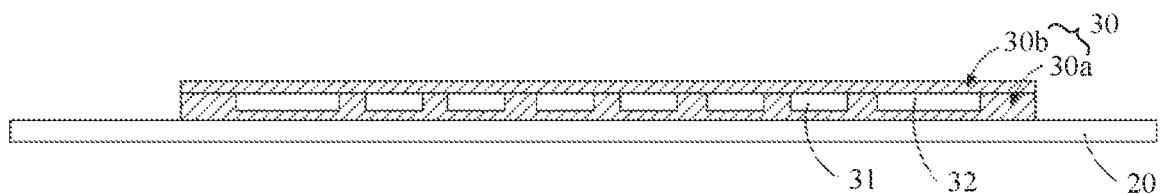

Step 130: Referring to FIG. 19c, cover the first metal layer 30a with a second metal layer 30b, where the second metal layer 30b seals the groove pattern to obtain a first flow passageway 31, a second flow passageway 32, and connecting flow passageways 33, and the patterned first metal layer 30a and the second metal layer 30b stacked on the first metal layer 30a form a thermally conductive layer 30 of the circuit board 100.

Step 140: Vacuumize the first flow passageway 31, the second flow passageway 32, and the connecting flow passageways 33 and inject a cooling medium. By vacuumizing the first flow passageway 31, the second flow passageway 32, and the connecting flow passageways 33, resistance of the cooling medium or vapor in the flow passageways is reduced, a heat transfer capability of the thermally conductive layer is enhanced, and a boiling point of the cooling medium is reduced, so that vapor-liquid change of the cooling medium becomes simpler.

Figure 19D:
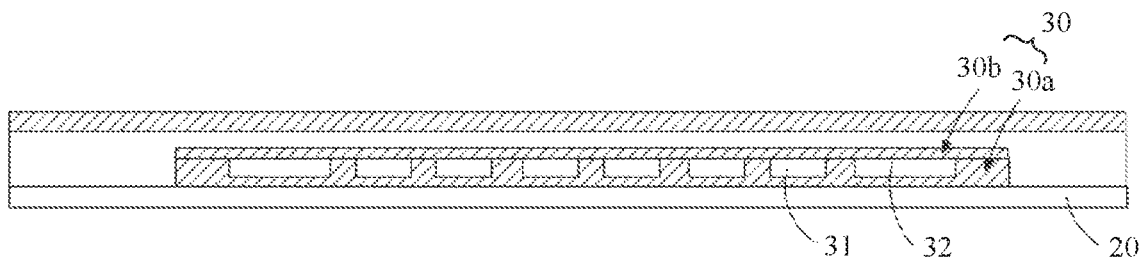

Step 150: Referring to FIG. 19d, sequentially form a second insulation layer 20 and a second metal material layer 30B on a side that is of the thermally conductive layer 30 and that is away from the first insulation layer 20.

Figure 19E:
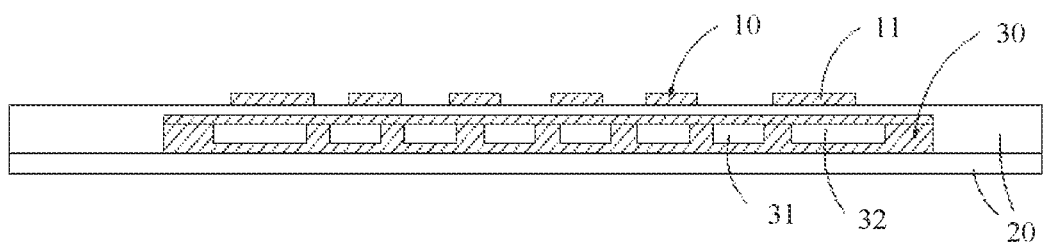

Step 160: Referring to FIG. 19e, pattern the second metal material layer 30B to obtain a signal layer 10. The signal layer 10 includes a plurality of signal cables 11 that are disposed in parallel and that extend in a length direction of the circuit board 100.

Step 170: Form a third insulation layer 20 on a side that is of the signal layer 10 and that is away from the thermally conductive layer 30, to obtain, through manufacturing, the circuit board 100 shown in FIG. 5. The signal layer 10 is protected by the third insulation layer 20, to prevent external water, oxygen, and the like from corroding the signal layer 10.

When a circuit board 300 is manufactured, a shield layer 70 is further disposed on a side that is of a signal layer 10 of the circuit board 300 and that is away from a thermally conductive layer 30. Therefore, a step needs to be added to obtain the shield layer 70. Specifically, a difference between a method for manufacturing the circuit board 200 and the method for manufacturing the circuit board 100 lies in that step 180 is further included: Referring to FIG. 16 again, sequentially form a third metal layer and a fourth insulation layer 20 on the third insulation layer 20. The third metal layer is the shield layer 70, the fourth insulation layer 20 is configured to protect the shield layer, and the signal layer 10 and the shield layer 70 are separated by using the third insulation layer. It may be understood that, when a quantity of thermally conductive layers 30, signal layers 10, or shield layers 70 needs to be increased during manufacturing of a circuit board in another embodiment of this application, steps 120 to 140 may be repeated to add a thermally conductive layer 30, step 150 may be repeated to add a signal layer 10, and step 180 may be repeated to add a shield layer 70.

In this application, by changing a liquid phase and a vapor phase of a cooling medium in a thermally conductive layer of the circuit board, heat can be efficiently transferred from a high temperature zone to a low temperature zone, thereby enhancing a heat transfer effect of the circuit board. In the electronic device, the circuit board is used to connect different modules or structures, so that heat of a module with a relatively large amount of heat can be transferred to a position or a heat dissipation structure with a relatively small amount of heat, thereby avoiding a local high temperature in the electronic device and ensuring uniform heat of all parts of the electronic device. In addition, a heat dissipation effect of the electronic device can be improved.

The foregoing descriptions are merely examples of implementations of this application. It should be noted that a person of ordinary skill in the art may make several improvements or polishing without departing from the principle of this application and the improvements or polishing shall fall within the protection scope of this application.

What is claimed is:

1. A circuit board comprising:
   a signal layer;
   an insulation layer; and
   a thermally conductive layer,
   wherein the signal layer, the insulation layer, and the thermally conductive layer are disposed in a stacked manner,
   wherein the signal layer is separated from the thermally conductive layer by the insulation layer,
   wherein the thermally conductive layer comprises at least one group of flow passageways,
   wherein at least one group of flow passageways is disposed at first intervals in a length direction of the circuit board,
   wherein each of the at least one group of flow passageways comprises:
      a first flow passageway configured to have a capillary force;
      a second flow passageway, wherein the first flow passageway and the second flow passageway are disposed in parallel at second intervals in a width direction of the circuit board, wherein the first flow passageway and the second flow passageway extend along the length direction, and wherein a first cross-sectional area of the first flow passageway is less than a second cross-sectional area of the second flow passageway;
      connecting flow passageways disposed at both ends of the first flow passageway and the second flow passageway, wherein the first flow passageway and the second flow passageway are coupled by the connecting flow passageways; and
      a cooling medium adapted to perform a vapor-liquid change and sealed in a closed space formed by the first flow passageway, the second flow passageway, and the connecting flow passageways.

2. The circuit board of claim 1, further comprising a plurality of thermally conductive layers, wherein first flow passageways of two adjacent thermally conductive layers are disposed in a staggered manner in a thickness direction of the circuit board.

3. The circuit board of claim 1, further comprising a plurality of insulation layers, wherein an outermost layer of the circuit board is an outermost insulation layer, and wherein the thermally conductive layer is attached to the outermost insulation layer.

4. The circuit board of claim 3, further comprising a plurality of thermally conductive layers, wherein first flow passageways of two adjacent thermally conductive layers are disposed in a staggered manner in a thickness direction of the circuit board.

5. The circuit board of claim 1, further comprising a plurality of thermally conductive layers made of a metal material, wherein the signal layer is located between any two of the thermally conductive layers.

6. The circuit board of claim 1, further comprising a signal shield layer disposed in a stacked manner on a side of the signal layer opposite from the side facing the thermally conductive layer.

7. The circuit board of claim 1, the at least one group of flow passageways comprises two groups of flow passageways, wherein first flow passageways in the two groups of flow passageways are coupled by a connecting flow passageway between the two groups of flow passageways.

8. The circuit board of claim 1, wherein the thermally conductive layer comprises:
   a main flow passageway; and
   a plurality of branch flow passageways coupled to the main flow passageway, wherein each of the branch flow passageways comprises a first flow passageway and a second flow passageway, and wherein all first flow passageways and all second flow passageways comprised on the branch flow passageways extend to the main flow passageway.

9. The circuit board of claim 1, further comprising a structure configured for enhancing a capillary force disposed in the first flow passageway.

10. The circuit board of claim 1, further comprising a support pillar disposed in the second flow passageway and comprising:
    a first end fastened to a bottom wall of the second flow passageway; and
    a second end extending along a thickness direction of the circuit board towards a top wall of the second flow passageway and abutting the top wall.

11. The circuit board of claim 1, further comprising a support pillar disposed in the second flow passageway and comprising:

a first end fastened to a bottom wall of the second flow passageway; and
a second end extending along a thickness direction of the circuit board towards a top wall of the second flow passageway, wherein a gap is formed between the second end and the top wall.

12. The circuit board of claim 1, wherein the first flow passageway comprises:
a straight flow section; and
a curved flow section located at a first end of the first flow passageway and coupled to the straight flow section.

13. An electronic device comprising:
a first system configured to generate a first heat;
a second system, wherein the second system is configured to generate a second heat that is lower than the first heat; and
a circuit board coupling the first system and the second system and configured to transfer the first heat to the second system, wherein the circuit board comprises:
a signal layer;
an insulation layer; and
a thermally conductive layer,
wherein the signal layer, the insulation layer, and the thermally conductive layer are disposed in a stacked manner,
wherein the signal layer is separated from the thermally conductive layer by the insulation layer,
wherein the thermally conductive layer comprises at least one group of flow passageways,
wherein at least one group of flow passageways is disposed at first intervals in a length direction of the circuit board,
wherein each of the at least one groups of flow passageways comprises:
a first flow passageway configured to have a capillary force;
a second flow passageway, wherein the first flow passageway and the second flow passageway are disposed in parallel at second intervals in a width direction of the circuit board, wherein the first flow passageway and the second flow passageway extend along the length direction, and wherein a first cross-sectional area of the first flow passageway is less than a second cross-sectional area of the second flow passageway;
connecting flow passageways disposed at both ends of the first flow passageway and the second flow passageway, wherein the first flow passageway and the second flow passageway are coupled by the connecting flow passageways; and
a cooling medium adapted to perform a vapor-liquid change and sealed in a closed space formed by the first flow passageway, the second flow passageway, and the connecting flow passageways.

14. The electronic device of claim 13, further comprising a third system disposed between the first system and the second system, wherein the circuit board passes through the third system and is attached to the third system, and wherein the circuit board is further configured to transfer the first heat and a third heat of the third system to the second system.

15. The electronic device of claim 14, wherein the first system and the second system are located on a same surface of the circuit board, and wherein the thermally conductive layer is proximate to the first system relative to the signal layer.

16. The electronic device of claim 13, further comprising a plurality of thermally conductive layers, wherein first flow passageways of two adjacent thermally conductive layers are disposed in a staggered manner in a thickness direction of the circuit board.

17. The electronic device of claim 13, further comprising a plurality of insulation layers, wherein an outermost layer of the circuit board is an outermost insulation layer, and wherein the thermally conductive layer is attached to the outermost insulation layer.

18. The electronic device of claim 13, wherein the first system and the second system are located on a same surface of the circuit board, and wherein the thermally conductive layer is proximate to the first system relative to the signal layer.

19. The electronic device of claim 13, wherein the first system is one of a screen system, a camera system, a fingerprint system, a structured light system, a motor system, a battery system, or a wireless charging system, and wherein the second system is a middle frame.

20. The electronic device of claim 13, wherein the first system is one of a screen system, a camera system, a fingerprint system, a structured light system, a motor system, a battery system, or a wireless charging system, and wherein the second system is a housing of the electronic device.

* * * * *